Oct. 7, 1969 H. SCHILLING 3,471,795

WIDE RANGE CONSTANT CURRENT GAIN AMPLIFIER

Filed May 2, 1967

INVENTOR
HARALD SCHILLING
BY Leonard Holtz
AGENT

United States Patent Office 3,471,795
Patented Oct. 7, 1969

3,471,795

WIDE RANGE CONSTANT CURRENT GAIN AMPLIFIER

Harald Schilling, Gundelfingen auf der Hohe, Germany, assignor to International Standard Electric Corporation, New York, N.Y., a corporation of Delaware Filed May 2, 1967, Ser. No. 635,415
Claims priority, application Germany, May 5, 1966, D 50,040
Int. Cl. H03f 3/68
U.S. Cl. 330—24 5 Claims

ABSTRACT OF THE DISCLOSURE

A wide dynamic range transistor amplifier comprising a plurality of transistors having their maximum current amplification factors occurring at different values of collector current and having their emitter and collector electrodes coupled in parallel. The base electrode of the lowest current transistor is coupled to an input terminal via a resistor and the base electrodes of the other transistors are coupled to the input terminal via respective threshold circuits, each including the series combination of a resistor and a diode for causing successive ones of said transistors to become operative as the input signal level increases.

FIELD OF INVENTION

This invention relates to transistor amplifiers and more particularly to a wide dynamic range amplifier having a current amplification factor which is substantially constant over several decimal powers of collector curent.

DESCRIPTION OF THE PRIOR ART

The current amplification factor (current transfer ratio) of an individual transistor is dependent upon the collector current and passes through a maximum at a predetermined value of collector current, $I_{cm}$. This current, $I_{cm}$ at which the current amplificator factor is maximum, differs from one transistor type to another. Furthermore, the collector current range over which the current amplification factor is reasonably constant for any single transistor normally lies within only one to two decadic powers. The prior art solutions involved the use of feedback techniques and other complex designs.

Therefore, the main object of this invention is to provide an improved transistor amplifier, particularly one in which the current amplification factor is substantially constant over a wide range of collector currents and which is relatively simple in construction.

SUMMARY OF THE INVENTION

According to this invention, a transistor amplifier comprises a plurality of transistors having their maximum current amplification factors occurring at different values of collector currents, each said transistor having first, second and third electrodes, respectively. The first electrodes of each transistors are coupled together and to a load device, said load device being further coupled to a D.C. voltage source. The second electrodes of each transistor are also coupled together. A resistor couples the third electrode of the transistor whose maximum current amplification factor occurs at the lowest value of collector current to an input terminal and respective threshold circuits coupled the third electrodes of the other transistors to the input terminal. Each transistor provides a usable amplification over a partial range of the overall collector current range of the amplifier, the partial ranges being either adjacent to, separating from, or overlapping each other.

DESCRIPTION OF THE PREFERRED EMBODIMENTS

Figure 1:
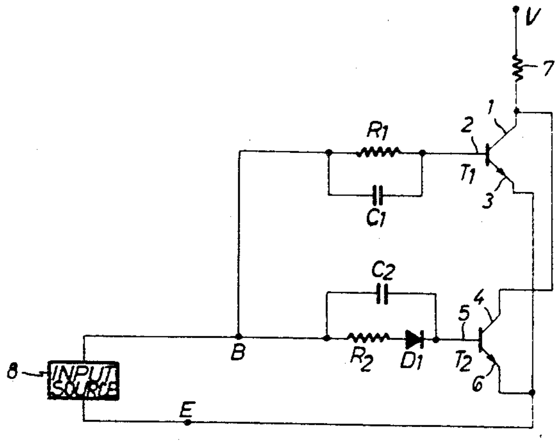
FIG. 1 illustrates a circuit diagram of a transistor amplifier according to this invention which comprises two transistors.

Referring to FIG. 1 there is shown a transistor amplifier according to this invention comprising transistors $T_1$ and $T_2$. The collector electrodes 1 and 4 of transistors $T_1$ and $T_2$, respectively, are coupled together and are further coupled to a load device 7. The other end of load device 7 is coupled to a source of D.C. potential V. The emitter electrodes 3 and 6 of transistors $T_1$ and $T_2$, respectively, are coupled together, the common point of the emitters being designated by the point E. The base electrode 2 of transistor $T_1$ is coupled to one end of resistor $R_1$, the other end of resistor $R_1$ being coupled to point B. The base electrode 5 of transistor $T_2$ is coupled to one end of the threshold circuit which comprises the series combination of resistor $R_2$ and diode $D_2$, the other end of said series combination being coupled to point B. A source of input signal 8 is coupled between points B and E. Each base electrodes 2 and 5 is further optionally coupled to input terminal B via capacitors $C_1$ and $C_2$, respectively. The function of $C_1$ and $C_2$ will be discused subsequently herein.

In the embodiment of FIG. 1, transistor $T_1$ has a permissible collector dissipation which is smaller, e.g., by a factor of 10, than that of transistor $T_2$. The maximum current amplification of transistor $T_1$ occurs at the collector curent $I_{cm1}$, and that of transistor $T_2$ at the collector current $I_{cm2}$. The ratio of $I_{cm2}:I_{cm1}$ is indicated by *a*.

Due to the parallel connection of the two transistors $T_1$ and $T_2$ it is seen that they are voltage controlled, so that in each transistor there is only flowing the base current corresponding to the base-emitter voltage of each transistor. Now, for the purpose of explanation, it is assumed that the base terminals 2 and 5 of the two transistors $T_1$ and $T_2$, respectively, are directly coupled to one another instead of as illustrated in FIGURE 1. This direct connection would result in a base current distribution between the two transistors $T_1$ and $T_2$ at a ratio of approximately 1:20. This is due to the fact that the transistor $T_2$, having a higher permissible collector dissipation has a larger emitter surface and consequently, requires a lower base-emitter voltage for a particular base current than transistor $T_1$. However, due to the particular coupling of the transistors, the base-emitter voltage for both transistors is alike, and correspondingly a greater current will flow in the transistor $T_2$.

This, however, is an undesired effect because for smaller values of base currents it is desired that just the transistor $T_1$ be operated. Therefore, the diode $D_1$, operated in its forward direction, is coupled to the base electrode 5 of transistor $T_2$ (as illustrated in FIGURE 1) in order to increase the effective base-emitter voltage of transistor $T_2$ by the threshold voltage value of diode $D_1$.

By virtue of this arrangement, which is illustrated in FIG. 1, only transistor $T_1$ operates with small base input currents. At these small input currents transistor $T_2$ does not operate due to the presence of diode $D_1$. The resistor $R_1$, coupled between the base electrode 2 of transistor $T_1$ and the point B causes the effective base-emitter voltage of transistor $T_1$ to increase as the input base current increases due to the increasing voltage drop thereacross. Note that the effective base-emitter voltage which is referred to above, refers to the voltage $V_{be}$ as illustrated in FIG. 1. Resistor $R_1$ also limits the base current in transistor $T_1$ and in the case of higher values of $R_1$, the base current is limited to such an extent that transistor $T_1$ is prevented from being overloaded. When the effective base-emitter voltage of transistor $T_1$ reaches the value of the effective base-emitter voltage of transistor $T_2$ (this effective voltage consists of the normal $V_{be}$ plus the diode threshold voltage), a portion of the total base current supplied by input source 8 which exceeds the base current drawn by transistor $T_1$ will gradually be fed to transistor $T_2$ via the threshold circuit which comprises resistor $R_2$ and diode $D_1$.

The function of the resistor $R_2$ is to insure that transistor $T_2$ is protected from being overloaded. Experiments have shown that the resistive value of resistor $R_1$ should be higher than that of resistor $R_2$ in order to obtain optimum linearity of the overall current amplification factor of the amplifier. Preferably, the relationship $R_1=aR_2$ should exist where $a=I_{cm2}/I_{cm1}$.

The function of capacitors $C_1$ and $C_2$ is to improve the RF behavior of the amplifier illustrated in FIG. 1. In practice, it has been found that a suitable relationship between the values of capacitors $C_1$ and $C_2$ is $C_2=aC_1$ where $a=I_{cm2}/I_{cm1}$.

Figure 2:
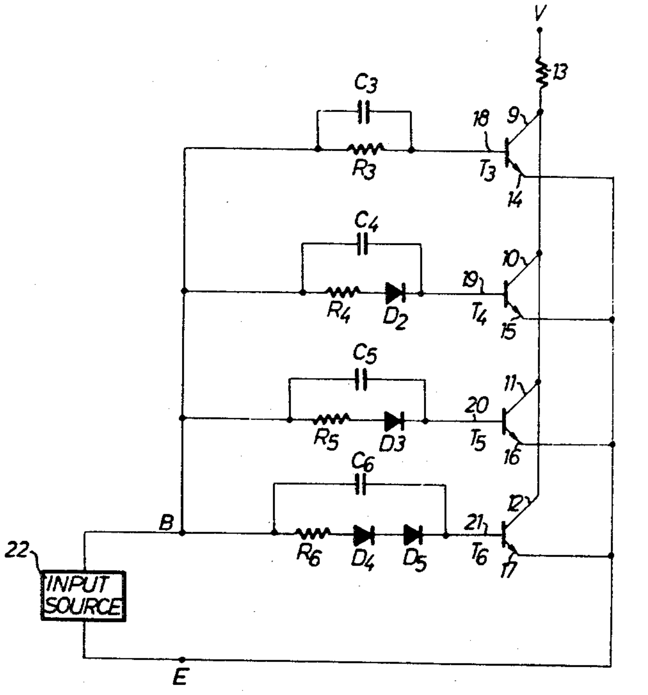
FIG. 2 illustrates a transistor amplifier according to this invention which comprises four transistors.

Referring to FIG. 2 another embodiment of this invention is illustrated which comprises four transistors $T_3$, $T_4$, $T_5$ and $T_6$ having their respective collectors 9, 10, 11 and 12 coupled to one terminal of load device 13. The other terminal of load 13 is coupled to a source of voltage V. The respective emitters 14, 15 16 and 17 of transistors $T_3$–$T_6$ are also coupled together and are further coupled to point E. The base electrode 18 of transistor $T_3$ is coupled to the input terminal, point B, via resistor $R_3$ and the base electrode 19 of transistor $T_4$ is coupled to point B via the threshold circuit comprising the series combination of resistor $R_4$ and diode $D_2$. The base electrode 20 of transistor $T_5$ is coupled to point B via the threshold circuit comprising the series combination of diode $D_3$ and resistor $R_5$ while the base electrode 21 of transistor $T_6$ is coupled to point B via the threshold circuit comprising the series combination of resistor $R_6$, diode $D_4$ and diode $D_5$. A source of input signal 22 is coupled between points B and E. The base electrodes 18–21 of transistors $T_3$–$T_6$ are optionally further coupled to point B via capacitors $C_3$–$C_6$, respectively, the functions of which will be subsequently discussed.

The transistors $T_3$–$T_6$ differ from one another by their permissible collector dissipations and therefore by the value of collector current for which the current amplification factor is a maximum. Transistor $T_3$ has the lowest permissible collector dissipation and the other transistors $T_4$, $T_5$ and $T_6$, respectively, each have successively higher permissible collector dissipations. In actual practice, it has been found that the permissible collector dissipations of each transistor may differ from one another each time by a factor of 5. The maximum current amplification factors of transistors $T_3$–$T_6$ are assumed to lie at the collector current $I_{cm3}$, $I_{cm4}$, $I_{cm5}$ and $I_{cm6}$, respectively. The ratio of these collector currents is as follows:

$$I_{cm4}:I_{cm3}=a;\ I_{cm5}:I_{cm4}=b;\ I_{cm6}:I_{cm5}=c$$

Similar dimensional requirements between resistors $R_1$ and $R_2$ in the circuit of FIG. 1 again apply to the resistors $R_3$–$R_6$ circuit of FIG. 2. The effective base-emitter voltage of transistor $T_6$ must be greater than that of $T_5$ and that of $T_5$ must be greater than that of $T_4$. Thereby, as the voltage between points B and E increases responsive to the input signal, $T_3$ will operate first, and as the voltage further increases the other transistors $T_4$–$T_6$ will be successively operated, the successive points of operation being determined by the actual base-emitter voltage, $V_{be}$, of each transistor added to the threshold voltage provided by the respective diodes coupled to the respective bases. The resistors coupled to each of the bases prevents overloading of the repsective transistors as the input signal level is increased. The operating ranges of transistor $T_3$–$T_6$ may be designed to overlap, to be adjacent each other or to be separated from each other, depending upon the particular use to which the amplifier is being put.

In practicing the instant invention, one way of providing the desired threshold voltages in each of the base circuits of transistors $T_4$–$T_6$, respectively, is as follows. It has been found that satisfactory results are achieved with $D_2$ being a germanium diode and diode $D_3$ being a silicon diode. It is well known that a silicon diode has a higher forward threshold voltage value than a germanium diode. In order to provide transistor $T_6$ with a higher effective base-emitter voltage than that of transistor $T_5$, two series coupled germanium diodes $D_4$ and $D_5$ are coupled to base electrode 21 of transistor 5. With respect to the resistors $R_3$–$R_6$, the following requirement must be met:

$$R_3>R_4>R_5>R_6$$

A preferable relationship between the resistors is:

$$R_3=aR_4=abR_5=abcR_6$$

For improving the RF hehavior of the transistor amplifiers illustrated in FIGURE 2, capacitors $C_3$, $C_4$, $C_5$ and $C_6$ are coupled between the base electrodes of transistors $T_3$, $T_4$, $T_5$ and $T_6$, respectively and the common input terminal B. In practice, a suitable relationship between the capacitors of FIGURE 2 was found to be:

$$C_6=cC_5=bcC_4=abcC_3$$

It is pointed out that a more detailed discussion of the circuitry disclosed herein is not deemed necessary for a proper understanding of the instant invention. It is believed that one ordinarily skilled in the art could successfully practice the instant invention by reference to the material disclosed herein. Furthermore, it is recognized that many modifications in the design of the described amplifiers may be made within the spirit of this invention.

While I have described above the principles of my invention in connection with specific apparatus it is to be clearly understood that this description is made only by way of example and not as a limitaiton to the scope of my invention as set forth in the accompanying claims.

I claim:

1. A wide range constant current gain amplifier, comprising:

a unidirectional voltage source;

at least three transistors having their maximum current amplification factors occurring at successively higher values of collective current, each said transistor having first, second and third electrodes, respectively;

a load device coupled to said voltage source;

means coupling the first electrode of each of said transistors together and to said load device;

means coupling two second electrodes of each of said transistors together;

an input terminal;

a first parallel R-C network coupling the third electrode of the transistor whose maximum current amplification factor occurs at the lowest value of collector current to said input terminal; and at least two threshold circuits, each successive threshold circuit coupling the third electrode of a respective successive one of said transistors to said input terminal, each said threshold circuit further including an R–C network, the capacitor of each successive threshold circuit having a greater value than the corresponding capacitor of the preceding network, and the resistor of each successive threshold circuit having a lesser value than the corresponding resistor of the preceding network, the transistors having their maximum current amplification factors occurring at said successively higher collector currents being respectively coupled to said input terminals by said threshold circuits having successively higher threshold levels.

2. A wide range constant current gain amplifier according to claim 1 wherein said first, second and third electrodes are collector, emitter and base electrodes, respectively.

3. A wide range constant current gain amplifier according to cliam 4 wherein the collector current at comprises the series combination of a resistor and at least one diode.

4. A wide range constant current gain amplifier according to claim 3 wherein the collector current at which a second transistor has its maximum current amplification factor is $a$ times the collector current at which a first transistor has its maximum amplification factor and wherein the resistance value of said first resistor is approximately equal to $a$ times the value of a second resistor associated with said threshold circuit coupled to said second transistor.

5. A wide range constant current gain amplifier according to claim 4 wherein the collector current at which the maximum current amplification factor of a third transistor occurs in $b$ times that current associated with said second transistor and wherein the resistance value of said second resistor is equal to $b$ times the value of a third resistor associated with said threshold circuit coupled to said third transistor.

References Cited

UNITED STATES PATENTS 3,225,209 12/1965 Schuster ------------ 330—15

FOREIGN PATENTS 965,421 Great Britain.

ROY LAKE, Primary Examiner

L. J. DAHL, Assistant Examiner

U.S. Cl. X.R.

330—22